(12) United States Patent
Kim et al.

(10) Patent No.: US 7,883,970 B2
(45) Date of Patent: Feb. 8, 2011

(54) SEMICONDUCTOR DEVICE HAVING DECOUPLING CAPACITOR AND METHOD OF FABRICATING THE SAME

(75) Inventors: Hyun-Ki Kim, Suwon-si (KR); Jung-Hwa Lee, Suwon-si (KR); Ji-Young Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 139 days.

(21) Appl. No.: 12/343,035

(22) Filed: Dec. 23, 2008

(65) Prior Publication Data

US 2009/0111232 A1    Apr. 30, 2009

Related U.S. Application Data

(62) Division of application No. 11/449,959, filed on Jun. 9, 2006, now Pat. No. 7,485,911.

(30) Foreign Application Priority Data

Sep. 5, 2005 (KR) ...................... 10-2005-0082357

(51) Int. Cl.
  *H01L 21/336* (2006.01)
(52) U.S. Cl. ........................ 438/270; 438/275; 438/588; 257/330; 257/333
(58) Field of Classification Search .................. 438/270, 438/275, 588; 257/330–333, E29.131, E29.134, 257/E29.257
  See application file for complete search history.

(56) References Cited

U.S. PATENT DOCUMENTS 6,521,538 B2 *   2/2003   Soga et al. .................. 438/695

(Continued)

FOREIGN PATENT DOCUMENTS

JP    9-199726    7/1997

(Continued)

*Primary Examiner*—Theresa T Doan
(74) *Attorney, Agent, or Firm*—Mills & Onello, LLP

(57) ABSTRACT

A semiconductor device having a decoupling capacitor and a method of fabricating the same are provided. The semiconductor device includes a semiconductor substrate having a cell region, a first peripheral circuit region, and a second peripheral circuit region. At least one channel trench is disposed in the cell region of the semiconductor substrate. At least one first capacitor trench is disposed in the first peripheral circuit region of the semiconductor substrate, and at least one second capacitor trench is disposed in the second peripheral circuit region of the semiconductor substrate. A gate electrode is disposed in the cell region of the semiconductor substrate and fills the channel trench. A first upper electrode is disposed in the first peripheral circuit region of the semiconductor substrate and fills at least the first capacitor trench. A second upper electrode is disposed in the second peripheral circuit region of the semiconductor substrate and fills at least the second capacitor trench. A gate dielectric layer is interposed between the channel trench and the gate electrode. A first dielectric layer is interposed between the semiconductor substrate of the first peripheral circuit region having the first capacitor trench and the first upper electrode and has the same thickness as the gate dielectric layer. A second dielectric layer is interposed between the semiconductor substrate of the second peripheral circuit region having the second capacitor trench and the second upper electrode and has a different thickness from the first dielectric layer.

14 Claims, 15 Drawing Sheets

U.S. PATENT DOCUMENTS

| | | | |
|---|---|---|---|
| 6,833,584 B2 * | 12/2004 | Henninger et al. | 257/334 |
| 7,459,358 B2 * | 12/2008 | Lee et al. | 438/197 |
| 2006/0113590 A1 | 6/2006 | Kim et al. | |

FOREIGN PATENT DOCUMENTS

| | | |
|---|---|---|
| KR | 2000-0045474 A | 7/2000 |
| KR | 2002-0058019 | 7/2002 |
| KR | 10-2004-0001962 A | 1/2004 |
| WO | 01/37320 A2 | 5/2001 |

* cited by examiner

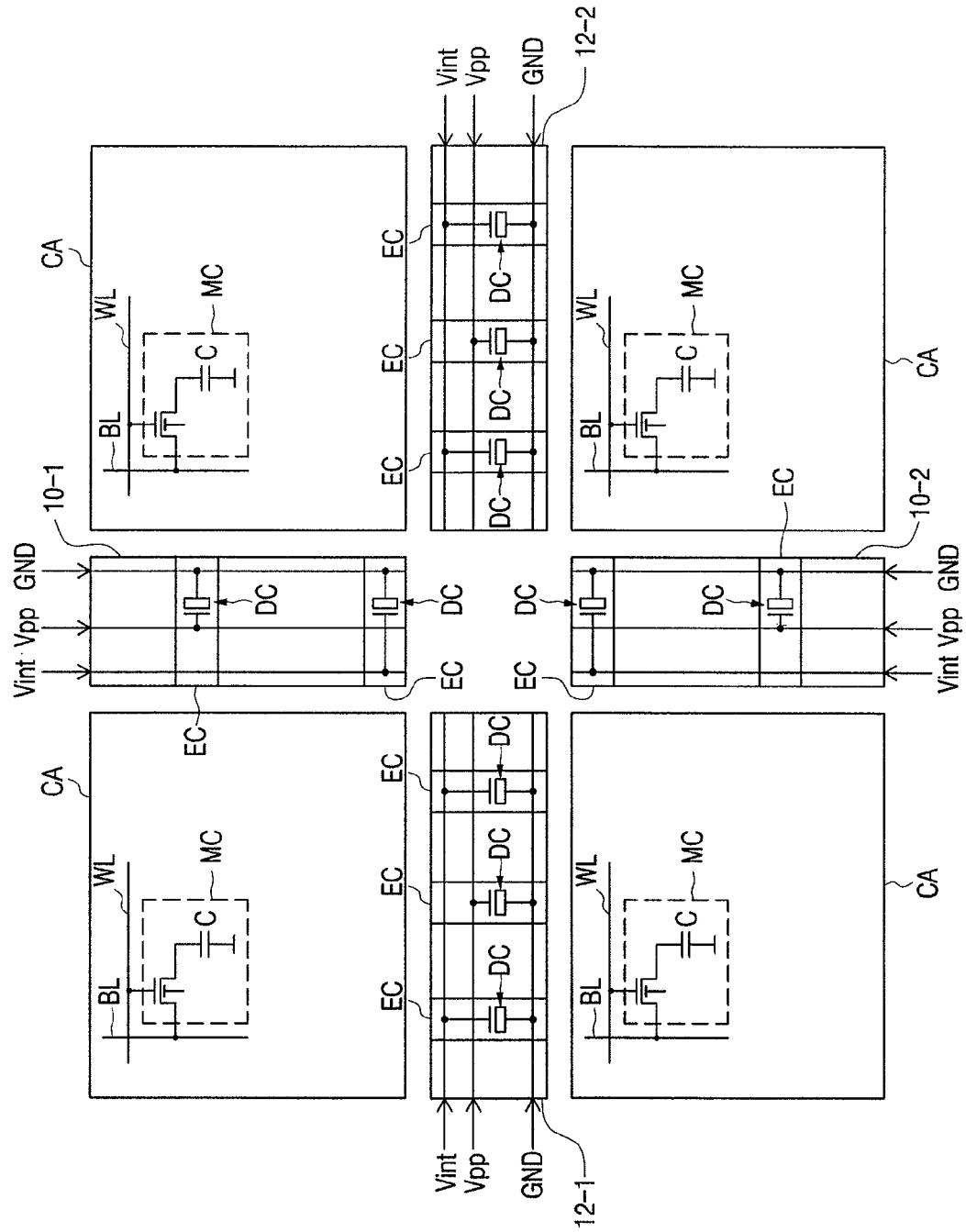

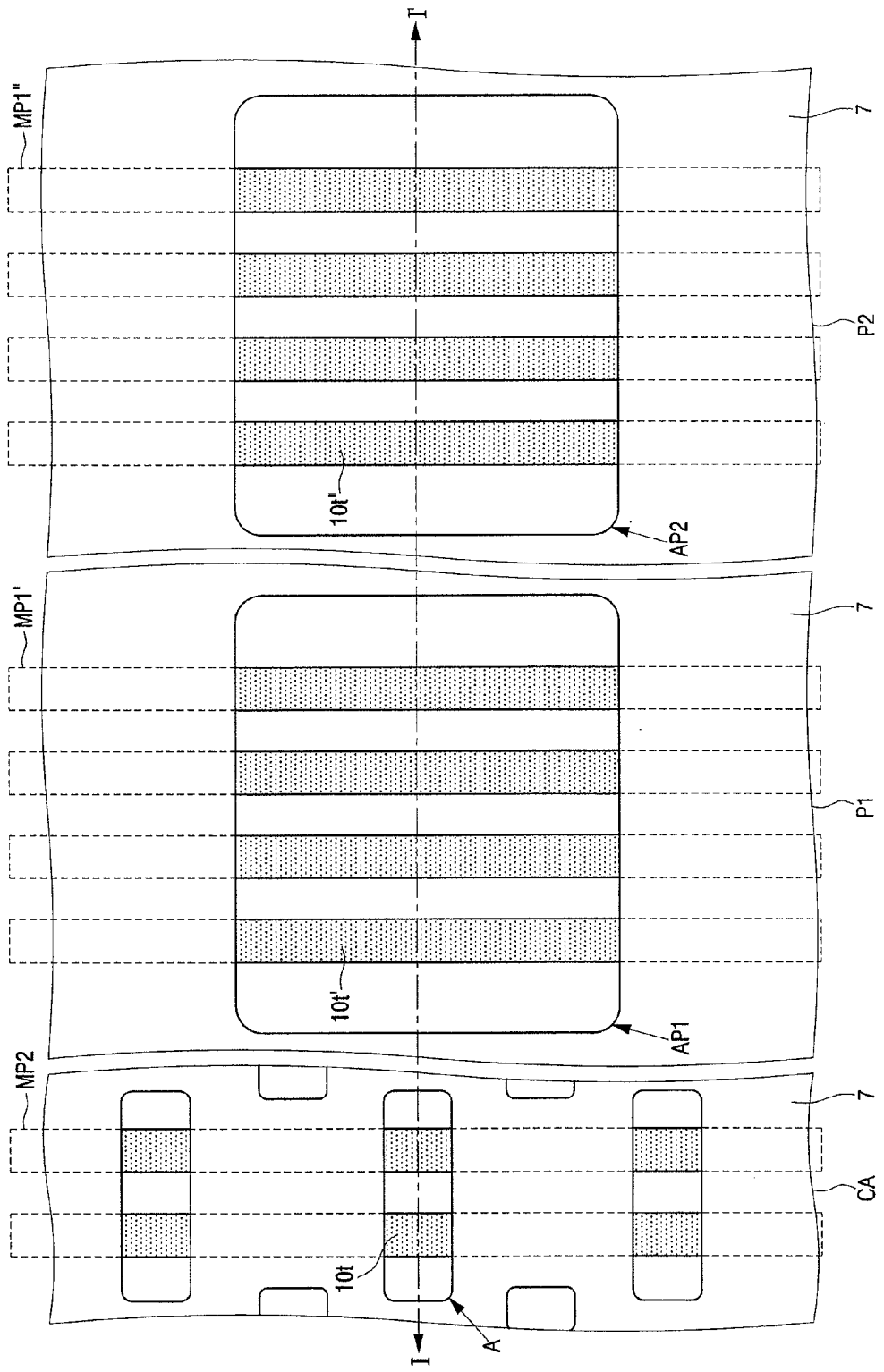

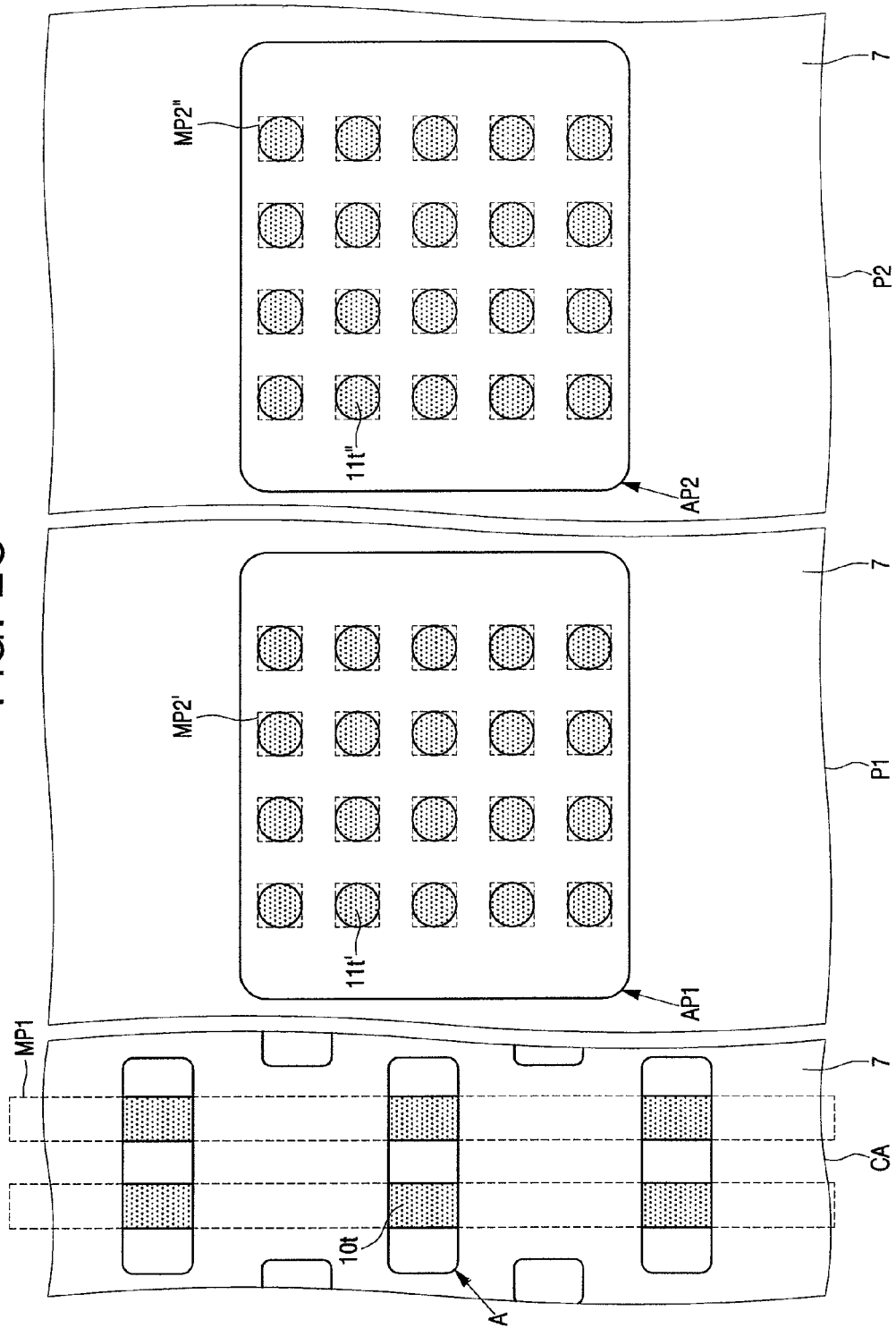

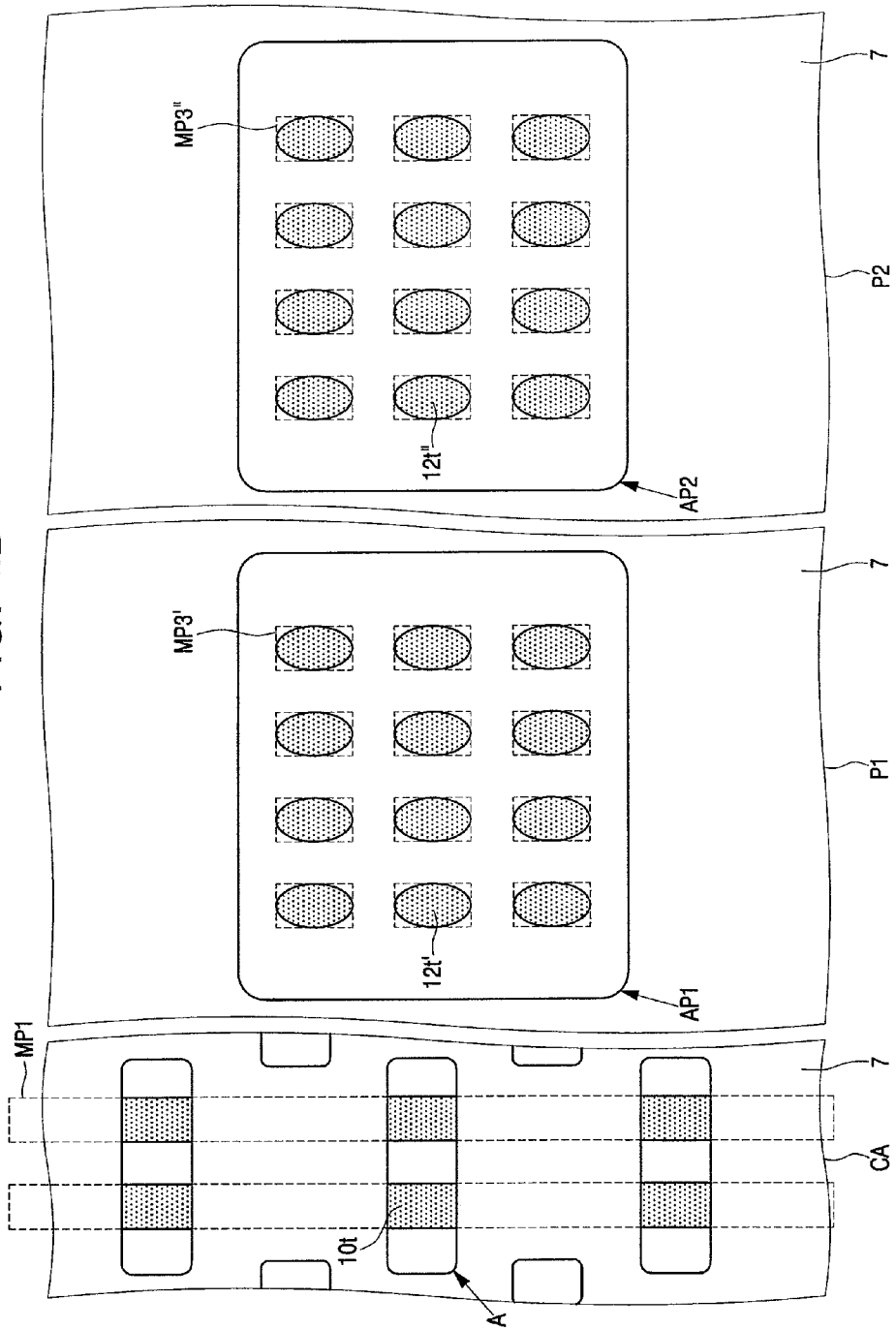

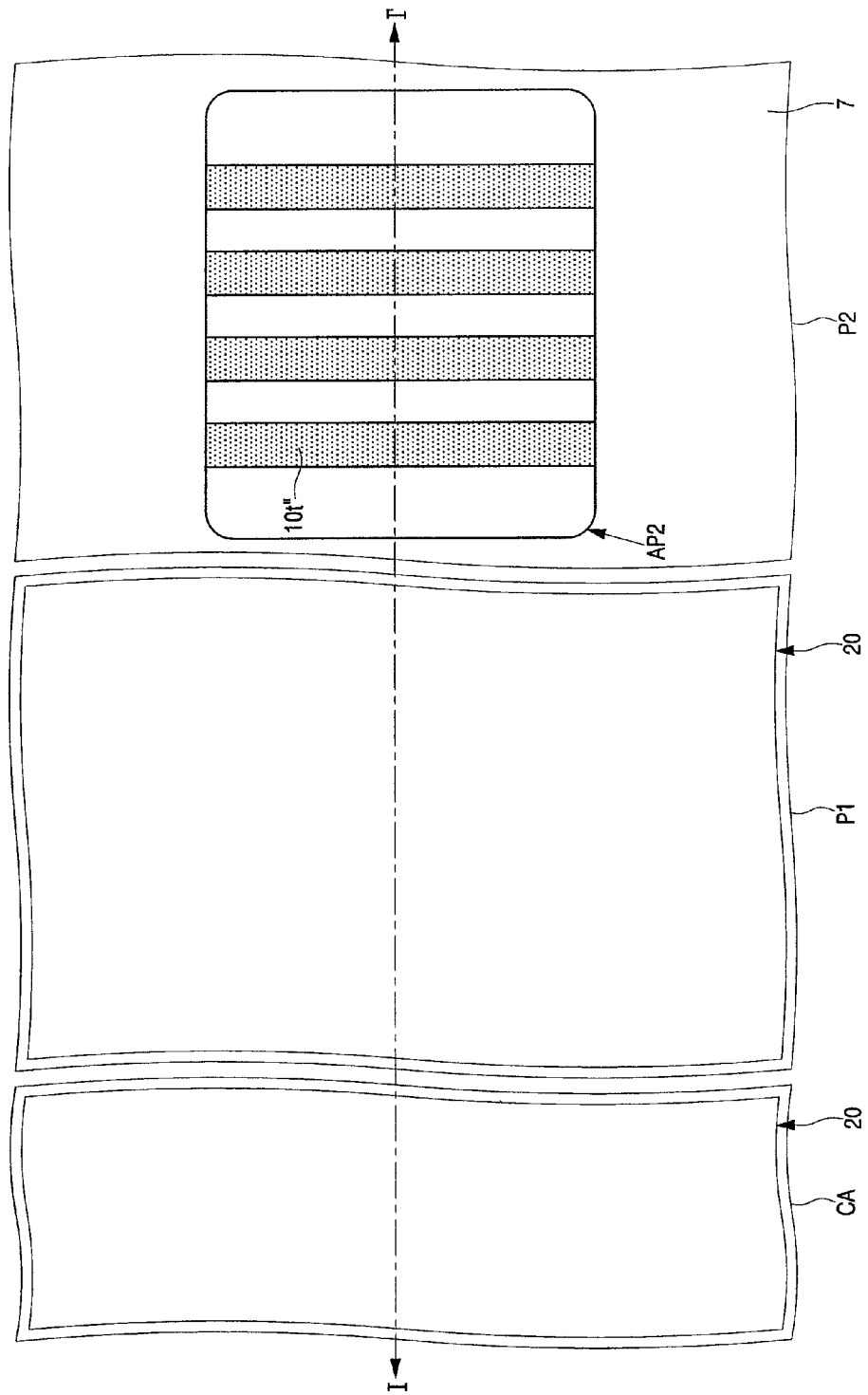

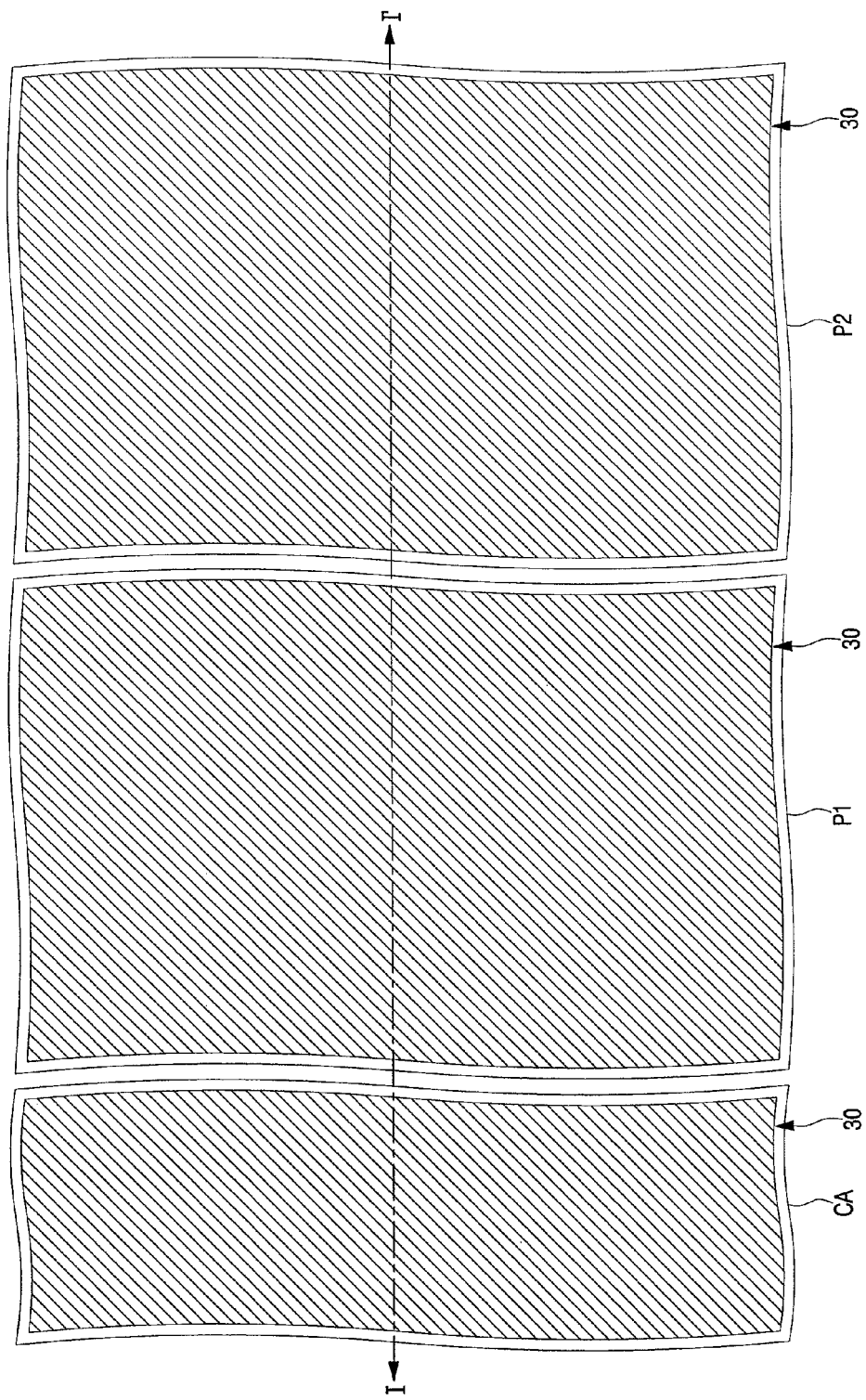

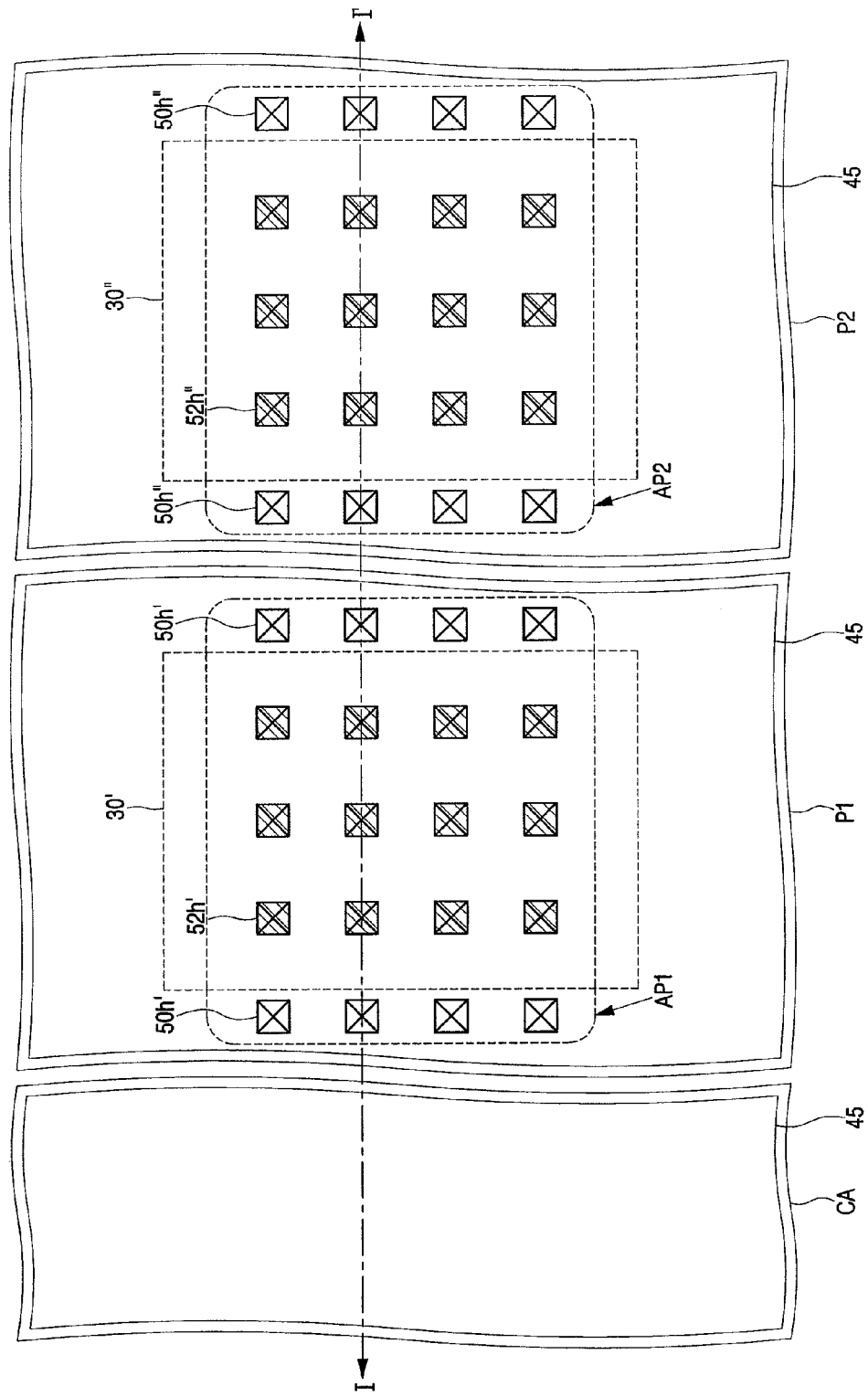

SEMICONDUCTOR DEVICE HAVING DECOUPLING CAPACITOR AND METHOD OF FABRICATING THE SAME

This application is a divisional application of U.S. patent application Ser. No. 11/449,959, filed Jun. 9, 2006, which claims the benefit of Korean Patent Application Number 10-2005-0082357, filed Sep. 5, 2005, the contents of which applications are hereby incorporated herein in their entirety by reference.

BACKGROUND OF THE INVENTION

1. Field of the Invention

The present invention relates to a semiconductor device and a method of fabricating the same, and more particularly, to a semiconductor device having a decoupling capacitor and a method of fabricating the same.

2. Description of Related Art

A decoupling capacitor of a semiconductor device is required by most very large scale integration (VLSI) circuits in order to minimize a noise effect. The decoupling capacitor is connected to various power supplies of logic and memory array circuits. Irrespective of whether power is externally supplied or internally produced, there is typically a variation of about −0.5 to 3.5 V in the power supplied on an advanced DRAM array. As a result, it is difficult to provide a decoupling capacitor adequate for all various power supplies.

An external power supply Vext of about 1.8 V is internally boosted or dropped to generate internal power supplies. In this case, a boosted internal power supply Vpp is internally generated by a charge pump and regulated by a voltage regulator. While data is being read from a DRAM cell or written in the DRAM cell, a word line accesses the boosted internal power supply Vpp. The boosted internal power supply Vpp is normally much higher than the external power supply Vext. As an example, when DRAM technology provides an external power supply Vext of 1.8 V, the boost internal power supply Vpp may be 3.0 V. The boost internal power supply Vpp is needed to increase the access time of the DRAM. Thus, when the word line accesses the boosted internal power supply Vpp, a large current is supplied from the boosted internal power supply Vpp. If a decoupling capacitor of the boosted internal power supply Vpp does not have sufficient capacitance, a noise spike may occur in the boosted internal power supply Vpp.

Also, the external power supply Vext may be dropped to produce a reduced internal power supply Vint. The dropped internal power supply Vint serves to supply power to portions of the semiconductor device other than the word line, which need low power.

In general, a decoupling capacitor of a conventional semiconductor device is filled in an empty space of a peripheral circuit region outside of a cell region. Accordingly, a region filled with the decoupling capacitor is restricted, and it is necessary to maximize the capacitance of the decoupling capacitor in the restricted region to enhance a filtering effect.

A method of forming a decoupling capacitor having a large capacitance in the restricted region is disclosed in Korean Patent Registration No. 329,616 entitled "Method of Forming Decoupling Capacitor of Semiconductor Device."

According to Korean Patent Registration No. 329,616, the method includes forming a plurality of trenches in a semiconductor substrate having a decoupling capacitor forming region, forming a gate oxide layer and a conductive layer for a gate electrode on a surface of the semiconductor substrate, and forming a gate electrode and a decoupling capacitor by patterning the gate oxide layer and the conductive layer. This method employs the trenches in order to increase the capacitance of the decoupling capacitor. However, when the decoupling capacitor is formed between power lines (e.g., a boosted internal power supply Vpp line and a ground GND line) having a high electrical potential difference, there is a stronger likelihood that a breakdown phenomenon will occur because of the gate oxide layer with a small thickness. Alternatively, when the gate oxide layer is formed to a large thickness to prevent the breakdown phenomenon, a decoupling capacitor formed between power lines with a low electrical potential difference has a reduced capacitance due to the thick gate oxide layer.

In another approach, a method of varying a decoupling capacitor with respect to a high voltage and a low voltage is disclosed in Korean Patent Laid-open Publication No. 2002-58019 entitled "Optimized Decoupling Capacitor using Lithographic Dummy Filler".

According to Korean Patent Laid-open Publication No. 2002-58019, a deep trench lithographic fill pattern may be used to form a decoupling capacitor for a low-voltage power supply including an internal low voltage for inputting and outputting data, a bit line equalization voltage, a bit line high voltage, or a negative word line voltage. For a high-voltage power supply, a plate capacitor or a field effect transistor (FET) capacitor may be formed by combining a gate filler with a diffusion filler. The formation of the plate capacitor or the FET capacitor may include forming a thin gate oxide capacitor for an external supply voltage or forming a thick gate oxide capacitor for a boosted word line supply voltage. The above-described method proposes a method of varying the thickness of the gate oxide layer with respect to a high-voltage power supply but does not provide a solution to a reduction in the capacitance of the decoupling capacitor caused by an increase in the thickness of the gate oxide layer.

SUMMARY OF THE INVENTION

The invention provides a semiconductor device having a decoupling capacitor, which prevents breakdown in a dielectric layer in consideration of an electrical potential difference between power supply voltages and is suitable to increase capacitance per unit area compared to a conventional semiconductor device.

The invention also provides a method of fabricating a semiconductor device having a decoupling capacitor, which prevents breakdown in a dielectric layer in consideration of an electrical potential difference between power supply voltages and is suitable to increase capacitance per unit area compared to a conventional semiconductor device.

In one aspect, the present invention is directed to a semiconductor device having a decoupling capacitor. The semiconductor device includes a substrate having a cell region, a first peripheral circuit region, and a second peripheral circuit region. At least one channel trench is disposed in the cell region of the semiconductor substrate. At least one first capacitor trench is disposed in the first peripheral circuit region of the semiconductor substrate, and at least one second capacitor trench is disposed in the second peripheral circuit region of the semiconductor substrate. A gate electrode is disposed in the cell region of the semiconductor substrate and fills the channel trench. A first upper electrode is disposed in the first peripheral circuit region of the semiconductor substrate and fills at least the first capacitor trench. A second upper electrode is disposed in the second peripheral circuit region of the semiconductor substrate and fills at least the second capacitor trench. A gate dielectric layer is interposed between the channel trench and the gate electrode. A first dielectric layer is interposed between the semiconductor substrate of the first peripheral circuit region having the first capacitor trench and the first upper electrode. The first dielectric layer has the same thickness as the gate dielectric layer. A second dielectric layer is interposed between the semiconductor substrate of the second peripheral circuit region having the second capacitor trench and the second upper electrode. The second dielectric layer has a different thickness than the first dielectric layer.

In some embodiments of the present invention, a source region and a drain region may be disposed in the semiconductor substrate at both sides of the gate electrode, respectively. A first impurity region may be disposed in the semiconductor substrate adjacent to the first upper electrode. Also, a second impurity region may be disposed in the semiconductor substrate adjacent to the second upper electrode.

In other embodiments, an interlayer insulating layer may be disposed on the semiconductor substrate having the gate electrode and the first and second upper electrodes. Contact plugs may be disposed through the interlayer insulating layer and electrically connected to the first impurity region, the first upper electrode, the second impurity region, and the second upper electrode, respectively. A first lower electrode interconnection, a first upper electrode interconnection, a second lower electrode interconnection, and a second upper electrode interconnection may be disposed on the semiconductor substrate having the contact plugs and electrically connected to the first impurity region, the first upper electrode, the second impurity region, and the second upper electrode, respectively.

In still other embodiments, the second dielectric layer may have a smaller thickness than the first dielectric layer. In this case, a potential difference between power supply voltages applied to the first lower electrode interconnection and the first upper electrode interconnection may be larger than a potential difference between power supply voltages applied to the second lower electrode interconnection and the second upper electrode interconnection.

In yet other embodiments, the second dielectric layer may have a larger thickness than the first dielectric layer. In this case, a potential difference between power supply voltages applied to the second lower electrode interconnection and the second upper electrode interconnection may be larger than a potential difference between power supply voltages applied to the first lower electrode interconnection and the first upper electrode interconnection.

In yet other embodiments, the gate dielectric layer, the first dielectric layer, and the second dielectric layer may be formed of the same material.

In yet other embodiments, the gate dielectric layer, the first dielectric layer, and the second dielectric layer may be thermal oxide layers.

In yet other embodiments, each of the first and second capacitor trenches may include an upper trench and a lower trench, and the lower trench may have a larger width than the upper trench.

In yet other embodiments, each of the first and second capacitor trenches may have a line shape, a circular shape, or an oval shape when seen from a plan view.

In another aspect, the present invention is directed to a method of fabricating a semiconductor device having a decoupling capacitor. The method includes preparing a semiconductor substrate having a cell region, a first peripheral circuit region, and a second peripheral circuit region. At least one channel trench is formed in the cell region of the semiconductor substrate, at least one first capacitor trench is formed in the first peripheral circuit region of the semiconductor substrate, and at least one second capacitor trench is formed in the second peripheral circuit region of the semiconductor substrate. An inner wall of the channel trench is covered with a gate dielectric layer, at least an inner wall of the first capacitor trench is covered with a first dielectric layer, and at least an inner wall of the second capacitor trench is covered with a second dielectric layer. The first dielectric layer is formed to the same thickness as the gate dielectric layer and to a different thickness from the second dielectric layer. The channel trench covered with the gate dielectric layer is filled with a gate electrode, the first capacitor trench covered with the first dielectric layer is filled with a first upper electrode, and the second capacitor trench covered with the second dielectric layer is filled with a second upper electrode.

In some embodiments of the present invention, after forming the gate electrode and the first and second upper electrodes, impurity ions may be implanted into the semiconductor substrate using the gate electrode and the first and second upper electrodes as ion implantation masks. Thus, a source region and a drain region are formed in the cell region of the semiconductor substrate, and simultaneously, a first impurity region and a second impurity region are formed in the first and second peripheral circuit regions of the semiconductor substrate, respectively.

In other embodiments, after implanting the impurity ions into the semiconductor substrate, an interlayer insulating layer may be formed on the semiconductor substrate having the gate electrode and the first and second upper electrodes. Thereafter, contact plugs may be formed through the interlayer insulating layer such that the contact plugs are electrically connected to the first impurity region, the first upper electrode, the second impurity region, and the second upper electrode, respectively. A first lower electrode interconnection, a first upper electrode interconnection, a second lower electrode interconnection, a second upper electrode interconnection may be formed on the semiconductor substrate having the contact plugs. The first lower electrode interconnection, the first upper electrode interconnection, the second lower electrode interconnection, the second upper electrode interconnection may be electrically connected to the first impurity region, the first upper electrode, the second impurity region, and the second upper electrode, respectively.

In still other embodiments, each of the first and second capacitor trenches may include an upper trench and a lower trench, and the lower trench may be formed to a larger width than the upper trench.

In yet other embodiments, the gate dielectric layer, the first dielectric layer, and the second dielectric layer may be formed of thermal oxide layers.

In yet other embodiments, the second dielectric layer may be formed thinner than the first dielectric layer.

In yet other embodiments, the second dielectric layer may be formed thicker than the first dielectric layer.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIG. 1 shows the layout of an example configuration of a semiconductor device having a typical decoupling capacitor.

FIGS. 2A, 3A, 4A, 5A, 6A and 7A are schematic plan views illustrating a method of fabricating a semiconductor device having a decoupling capacitor according to exemplary embodiments of the present invention.

FIGS. 2C and 2D are schematic plan views of capacitor trenches according to other exemplary embodiments of the present invention.

DETAILED DESCRIPTION OF THE INVENTION

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art.

FIG. 1 shows the layout of an example configuration of a semiconductor device having a typical decoupling capacitor.

Referring to FIG. 1, the semiconductor device includes cell regions CA and peripheral circuit regions that surround the cell regions CA. Row decoders 10-1 and 10-2, column decoders, and data input/output control circuits 12-1 and 12-2 may be disposed in the peripheral circuit regions. The peripheral circuit regions include empty regions EC in which the row decoders 10-1 and 10-2, the column decoders, and the data input/output control circuits 12-1 and 12-2 are not disposed. Decoupling capacitors DC are disposed in the empty regions EC.

Each of the cell regions CA includes a plurality of memory cells, each of which includes a cell capacitor C and a cell transistor T that is connected between a word line WL and a bit line BL. Each of the decoupling capacitors DC includes a MOS capacitor that is connected in parallel between power supplies such as power supply voltages and ground voltages GND. The power supply voltages may be a boosted internal power supply Vpp, a downed internal power supply Vint, or an external power supply Vext.

Figure 2B:
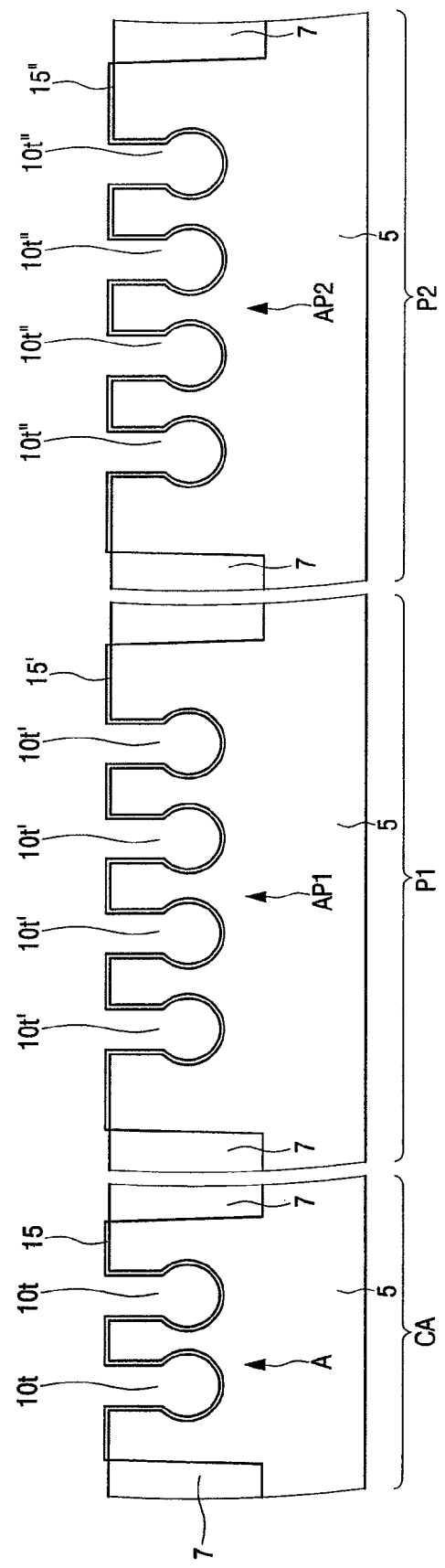
FIGS. 2B, 3B, 4B, 5B, 6B and 7B are schematic cross-sectional views taken along lines I-I' of FIGS. 2A, 3A, 4A, 5A, 6A and 7A, respectively.

FIGS. 2A, 3A, 4A, 5A, 6A and 7A are plan views illustrating a method of fabricating a semiconductor device having a decoupling capacitor according to exemplary embodiments of the present invention, FIGS. 2B, 3B, 4B, 5B, 6B and 7B are cross-sectional views taken along lines I-I' of FIGS. 2A, 3A, 4A, 5A, 6A and 7A, respectively, and FIGS. 2C and 2D are plan views of capacitor trenches according to other exemplary embodiments of the present invention.

Referring to FIGS. 2A through 2D, a semiconductor substrate 5 having a cell region CA, a first peripheral circuit region P1, and a second peripheral circuit region P2 is prepared. An isolation layer 7 is formed in the semiconductor substrate 5 to define a cell active region A, a first peripheral circuit active region AP1, and a second peripheral circuit active region AP2. The isolation layer 7 may be a trench isolation layer.

Channel trenches 10t are formed in the cell regions CA of the semiconductor substrate 5 across the cell active region CA. Each of the channel trenches 10t may include an upper trench and a lower trench, and the lower trench may be formed wider than the upper trench. During the formation of the channel trenches 10t, first capacitor trenches 10t' may be formed in the first peripheral circuit active region AP1 of the semiconductor substrate 5, second capacitor trenches 10t'' may be formed in the second peripheral circuit active region AP2 of the semiconductor substrate 5, and each of the first and second capacitor trenches 10t' and 10t'' may be formed in a line shape. Like the channel trenches 10t, each of the first and second capacitor trenches 10t' and 10t'' may include an upper trench and a lower trench, and the lower trench may be formed wider than the upper trench. In this case, photo mask patterns MP1, MP1', and MP1'' corresponding respectively to the cell region CA, the first peripheral circuit region P1, and the second peripheral circuit region P2 may be line patterns.

Alternatively, as shown in FIG. 2C, first capacitor trenches 11t' may be formed in the first peripheral circuit active region AP1, second capacitor trenches 11t'' may be formed in the second peripheral circuit active region AP2, and each of the first and second capacitor trenches 11t' and 11t'' may be formed in a circular island shape. In this case, photo mask patterns MP2' and MP2'' corresponding respectively to the first and second peripheral circuit regions P1 and P2 may be island-shaped quadrangular patterns.

Alternatively, as shown in FIG. 2D, first capacitor trenches 12t' may be formed in the first peripheral circuit active region AP1, second capacitor trenches 12t'' may be formed in the second peripheral circuit active region AP2, and each of the first and second capacitor trenches 12t' and 12t'' may be formed in an oval island shape. In this case, photo mask patterns MP3' and MP3'' corresponding respectively to the first and second peripheral circuit regions P1 and P2 may be island-shaped rectangular patterns. Although not shown in the drawings, the first and second capacitor trenches may be patterned in different shapes. For example, line-type first capacitor trenches 11t' may be formed in the first peripheral circuit region P1, and circular island-type second capacitor trenches 12t'' may be formed in the second peripheral circuit region P2.

In order to prevent a short channel effect caused by the high integration density of the semiconductor device, the channel trenches 10t may be formed to increase a channel length. On the other hand, the first and second capacitor trenches 10t', 11t', 12t', 10t'', 11t'', and 12t'' may be formed to increase the capacitance per unit area by increasing the effective areas of MOS-type decoupling capacitors that will be formed later.

A preliminary gate dielectric layer 15 is formed to cover inner walls of the channel trenches 10t and a top surface of the cell active region A, a first preliminary dielectric layer 15' is formed to cover a top surface of the first peripheral circuit active region AP1 and inner walls of the first channel trenches 10t', and a dummy dielectric layer 15'' is formed to cover a top surface of the second peripheral circuit active region AP2 and inner walls of the second channel trenches 10t''. The preliminary gate dielectric layer 15, the first preliminary dielectric layer 15', and the dummy dielectric layer 15'' may be formed by thermally oxidizing the semiconductor substrate 5 having the trenches.

Figure 3B:
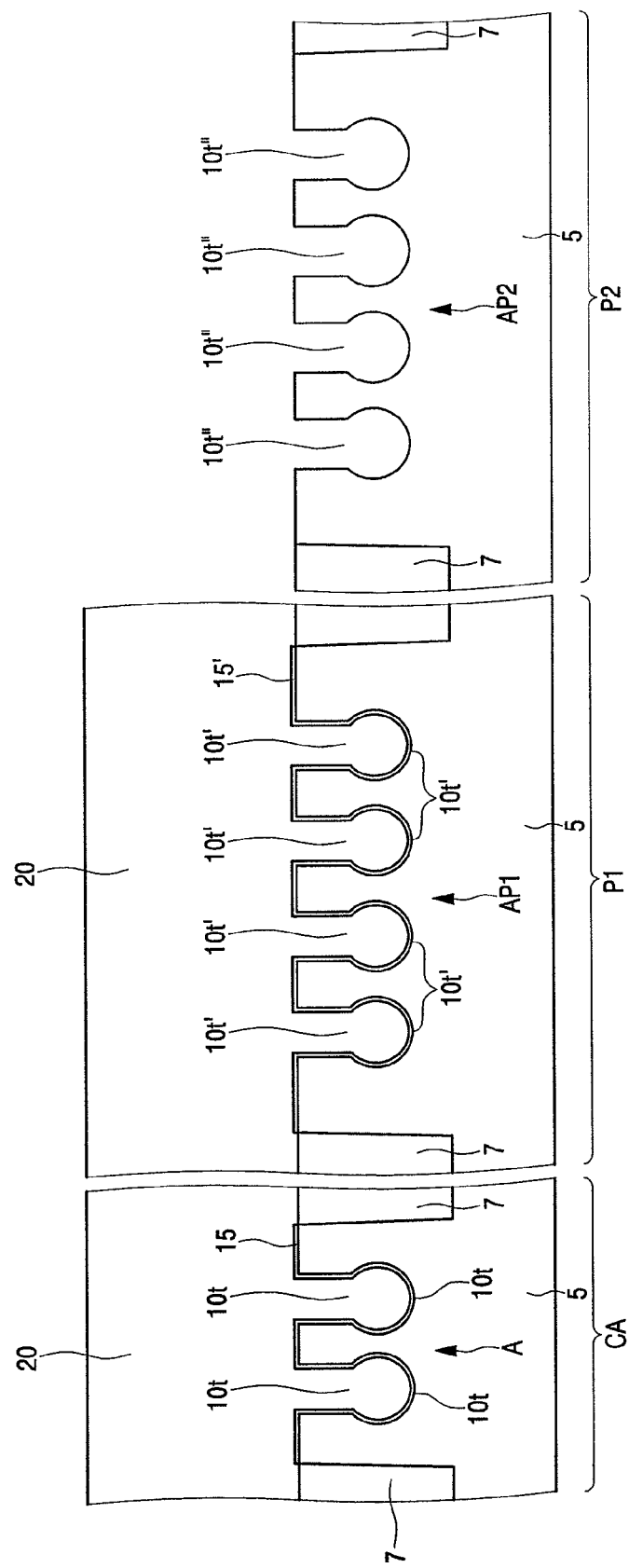

Referring to FIGS. 3A and 3B, a mask layer is formed on the semiconductor substrate 5 having the preliminary gate dielectric layer 15, the first preliminary dielectric layer 15', and the dummy dielectric layer 15''. The mask layer is patterned, thereby forming a mask pattern 20 to expose the second peripheral circuit region P2. An etching process is performed on the semiconductor substrate 5 having the mask pattern 20 so that the dummy dielectric layer 15'' is selectively removed from the second peripheral circuit region P2.

Figure 4B:
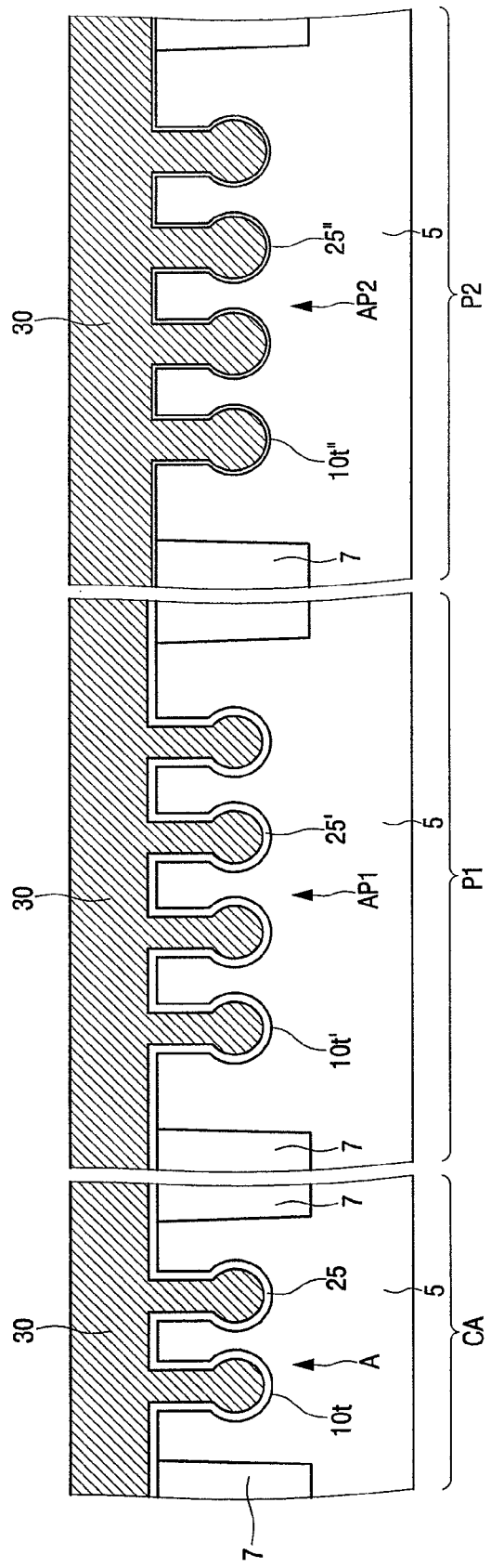

Referring to FIGS. 4A and 4B, the mask pattern 20 is removed. A dielectric layer is formed on the semiconductor substrate 5 from which the mask pattern 20 is removed. The dielectric layer may be formed by a thermal oxidation process. As a result, a gate dielectric layer 25 is formed thicker than the preliminary gate dielectric layer 15 in the cell active region A. During the formation of the gate dielectric layer 25, a first dielectric layer 25' may be formed thicker than the first preliminary dielectric layer 15' in the first peripheral circuit active region AP1, and a second dielectric layer 25" may be formed thinner than the first dielectric layer 25' in the second peripheral circuit active region AP2.

Thereafter, a conductive layer 30 is formed on the semiconductor substrate 5 having the gate dielectric layer 25 and the first and second dielectric layers 25' and 25". The conductive layer 30 may be formed of a polysilicon layer or a polysilicon layer and a tungsten silicide layer that are sequentially stacked.

Figure 5A:
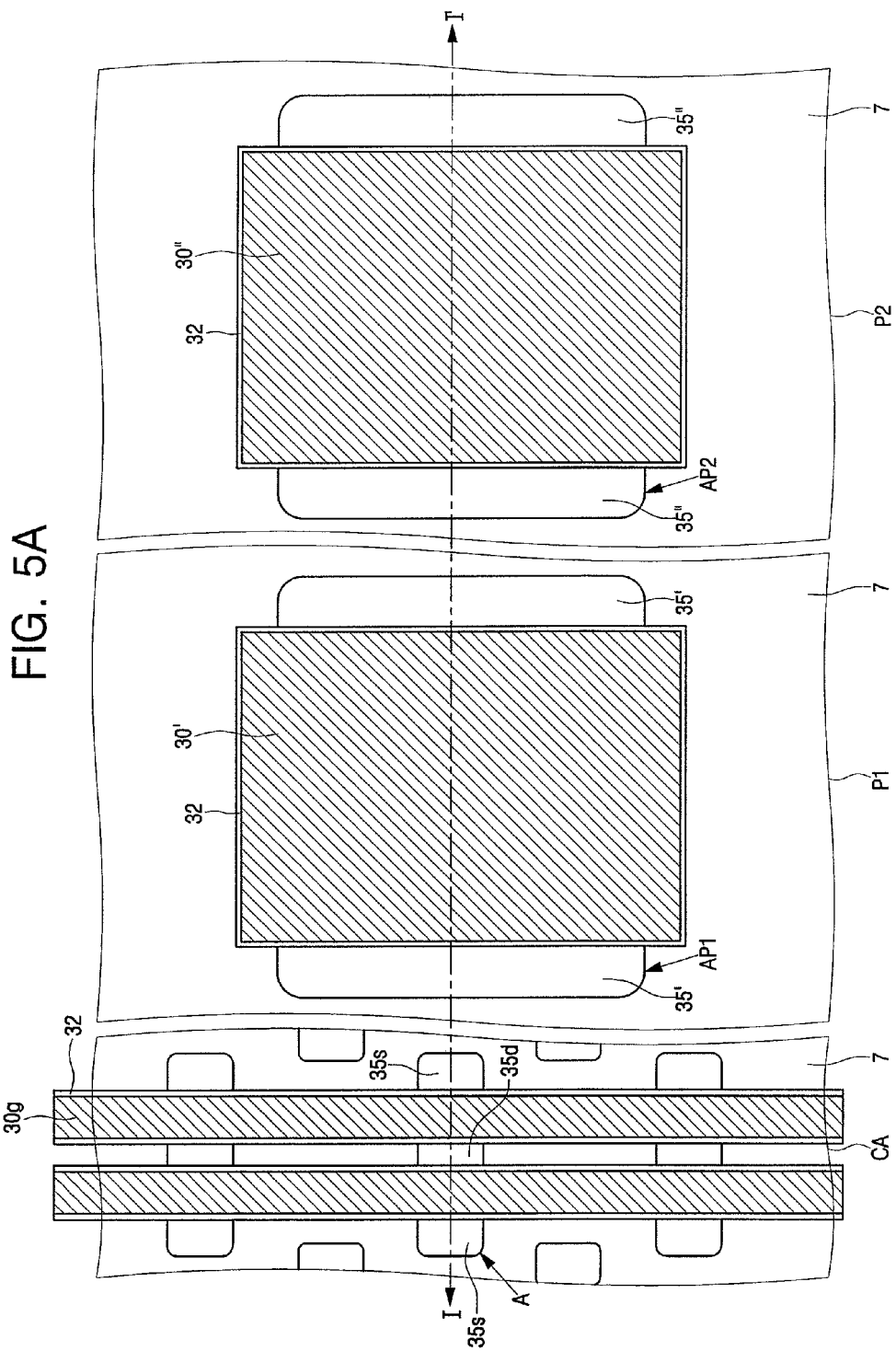
Figure 5B:
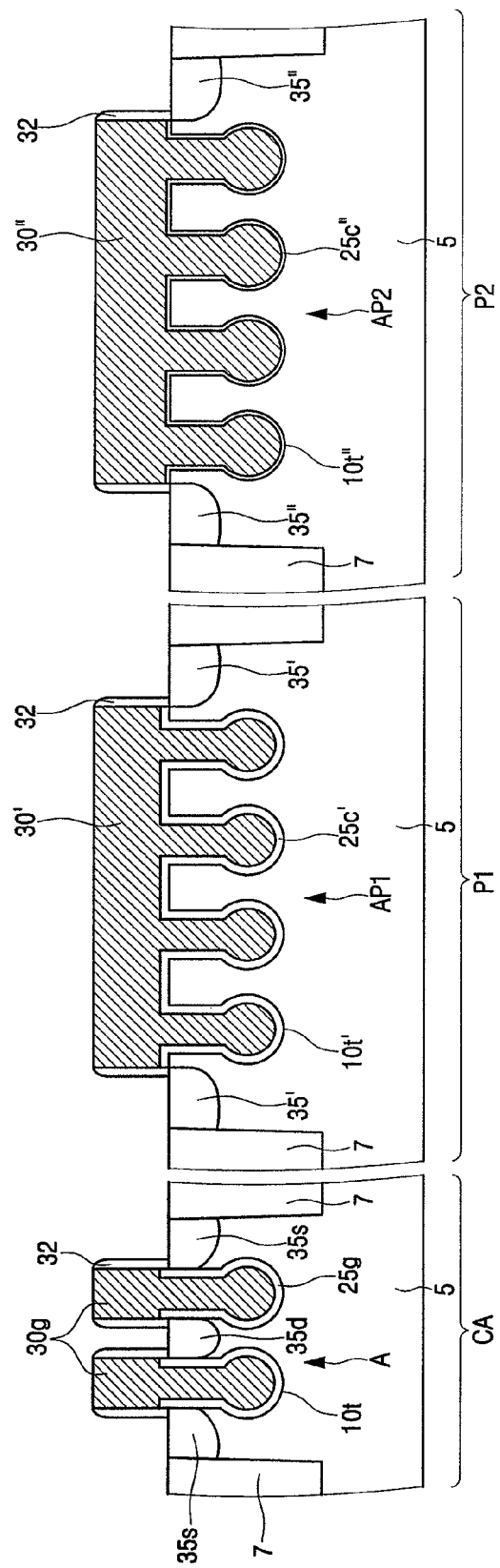

Referring to FIGS. 5A and 5B, the conductive layer 30 is patterned, thereby forming gate electrodes 30g that fill the channel trenches 10t across the cell active region A. While forming the gate electrodes 30g, a first upper electrode 30' may be formed to fill the first capacitor trenches 10t' at the same time. In this case, the first upper electrode 30' may be formed across the first peripheral circuit active region AP1 or formed to expose edges of the first peripheral circuit active region AP1. Also, a second upper electrode 30" is formed to fill the second capacitor trenches 10t" at the same time. Like the first upper electrode 30', the second upper electrode 30" may be formed across the second peripheral circuit active region AP2 or formed to expose edges of the second peripheral circuit active region AP2. In this case, while the conductive layer 30 is patterned, the gate dielectric layer 25 and the first and second dielectric layers 25' and 25" may be patterned. As a result, a patterned gate dielectric layer 25g and patterned first and second dielectric layers 25c' and 25c" may be obtained.

A spacer layer may be formed on the semiconductor substrate 5 having the patterned gate dielectric layer 25g and the patterned first and second dielectric layers 25c' and 25c". Thereafter, the semiconductor substrate 5 having the spacer layer may be etched back, thereby forming spacers 32 to cover sidewalls of the gate electrode 30g and the first and second upper electrodes 30' and 30".

Subsequently, impurity ions are implanted into the semiconductor substrate 5 having the spacers 32 using the gate electrode 30g and the first and second upper electrodes 30' and 30" as ion implantation masks. Thus, source regions 35s and a drain region 35d may be formed in the cell active region A. Simultaneously, first impurity regions 35' may be formed in the first peripheral circuit active region AP1, and second impurity regions 35" may be formed in the second peripheral circuit active region AP2.

Figure 6B:
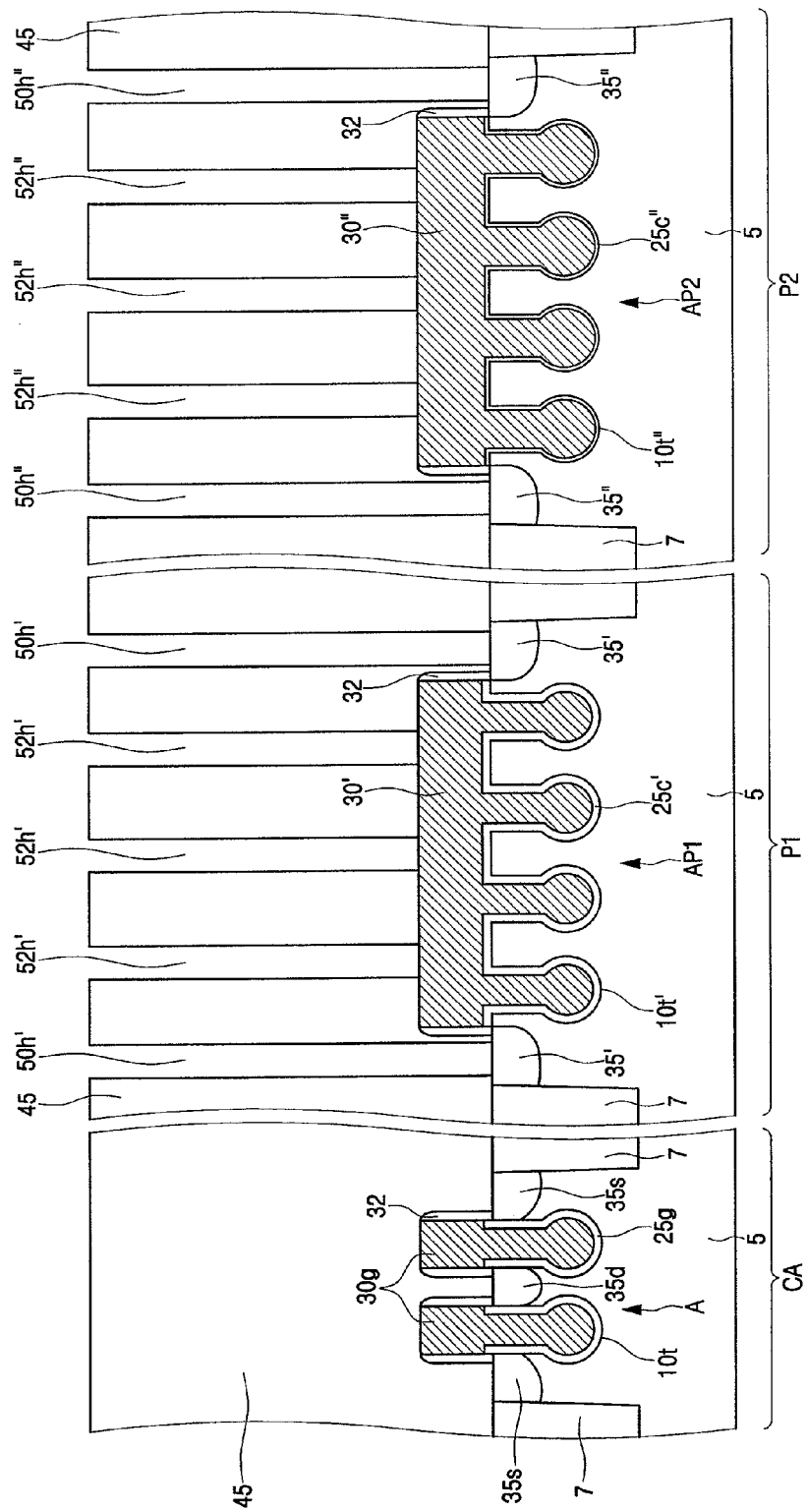

Referring to FIGS. 6A and 6B, an interlayer insulating layer 45 is formed on the semiconductor substrate 5 having the impurity regions. First lower electrode contact holes 50h' may be formed through the interlayer insulating layer 45 to expose predetermined regions of the first impurity regions 35'. During the formation of the first lower electrode contact holes 50h', first upper electrode contact holes 52h' may be formed through the interlayer insulating layer 45 to expose predetermined regions of the first upper electrode 30'. Also, second lower electrode contact holes 50h" may be formed through the interlayer insulating layer 45 to expose predetermined regions of the second impurity regions 35". Further, second upper electrode contact holes 52h" may be formed through the interlayer insulating layer 45 to expose predetermined regions of the second upper electrode 30".

Figure 7A:
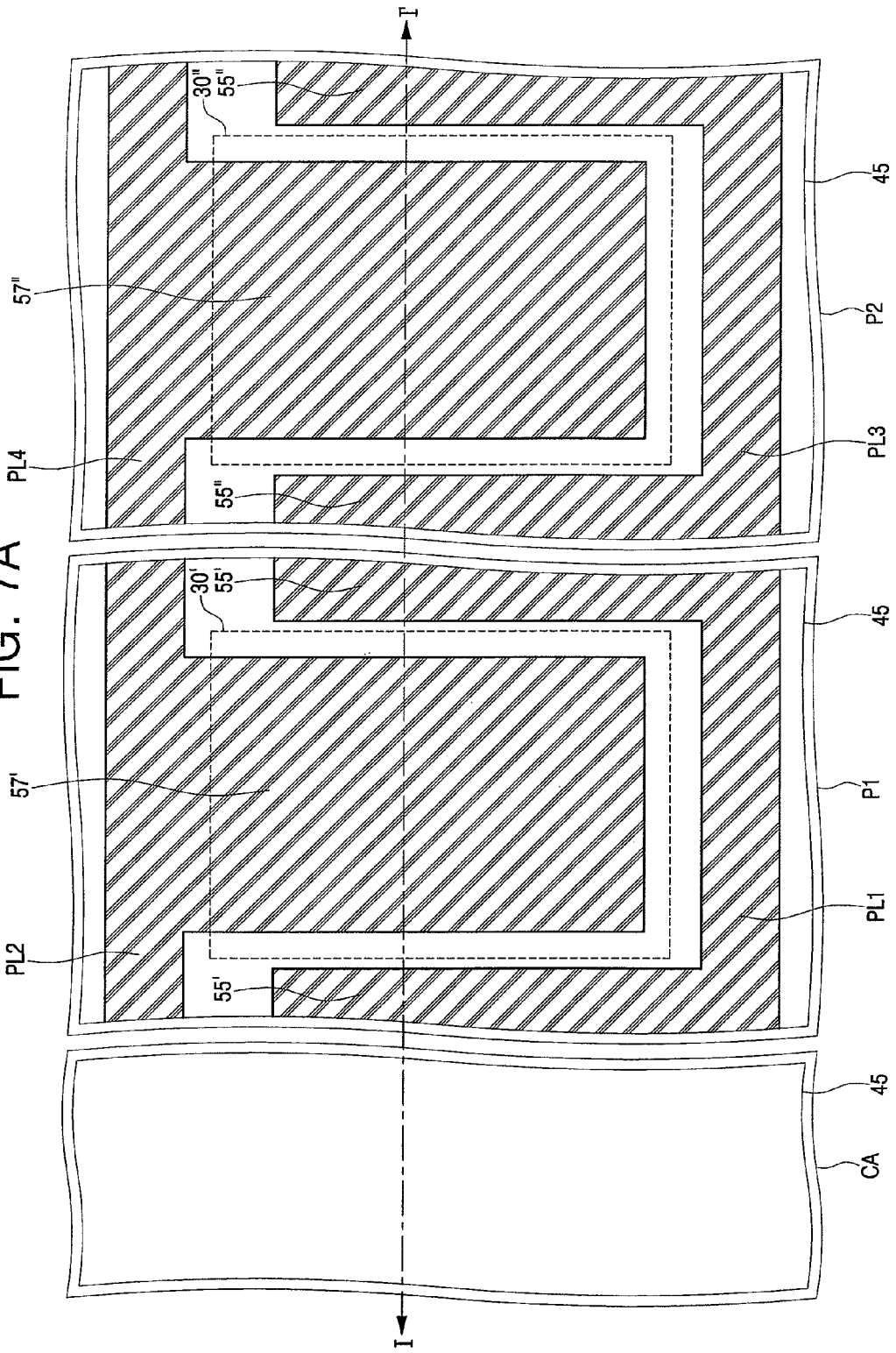
Figure 7B:
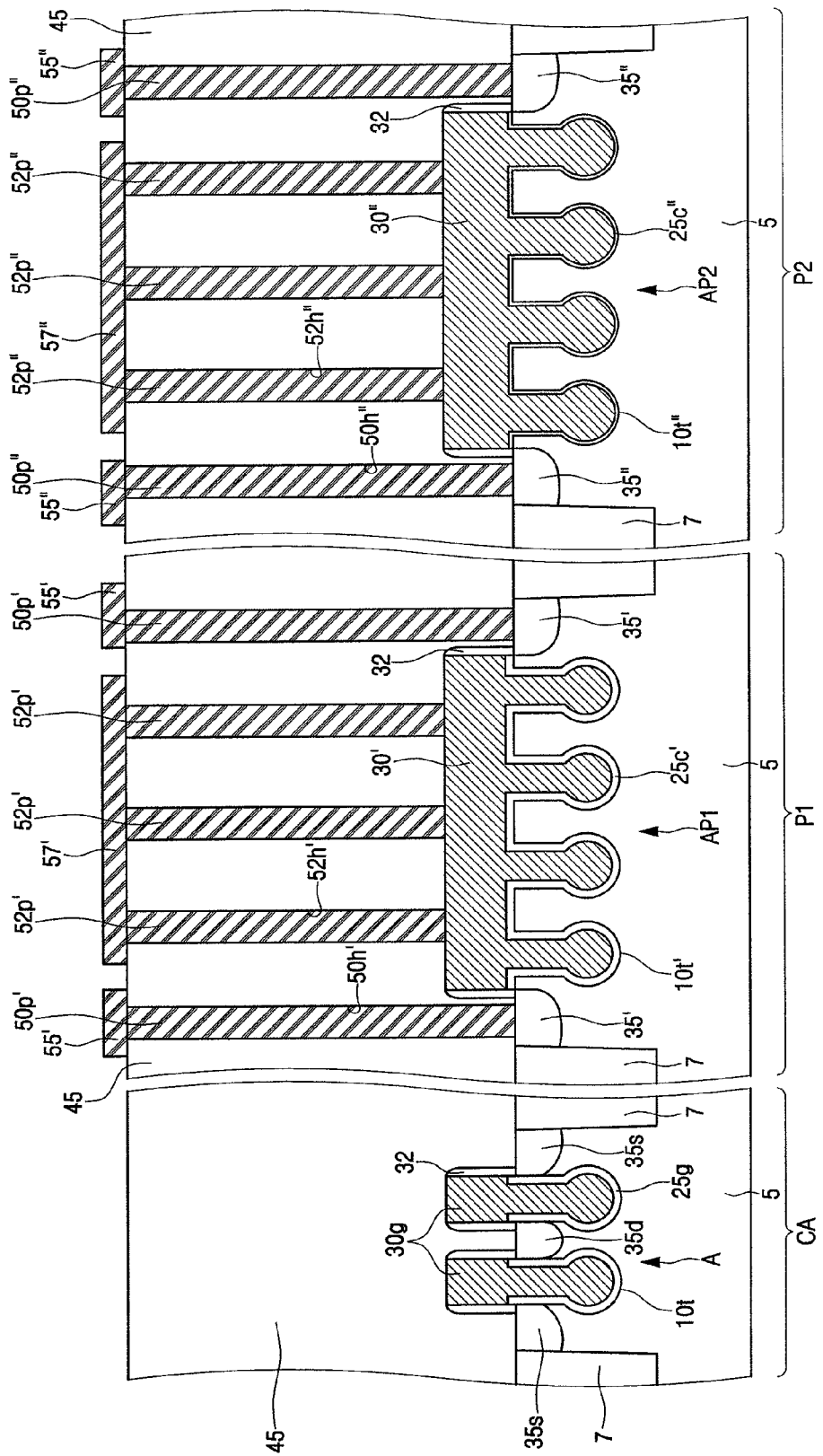

Referring to FIGS. 7A and 7B, first lower electrode contact plugs 50p' are formed to fill the first lower electrode contact holes 50h', first upper electrode contact plugs 52p' are formed to fill the first upper electrode contact holes 52h', second lower electrode contact plugs 50p" are formed to fill the second lower electrode contact holes 50h", and second upper electrode contact plugs 52p" are formed to fill the second upper electrode contact holes 52h".

Thereafter, an upper interconnection layer is formed on the semiconductor substrate 5 having the contact plugs 50p', 52p', 50p", and 52p". The upper interconnection layer may be patterned, thereby forming a first lower electrode interconnection 55', a first upper electrode interconnection 57', a second lower electrode interconnection 55", and a second upper electrode interconnection 57". The first lower electrode interconnection 55' is electrically connected to the first lower electrode contact plugs 50p', and the first upper electrode interconnection 57' is electrically connected to the first upper electrode contact plugs 52p'. Also, the second lower electrode interconnection 55" is electrically connected to the second lower electrode contact plugs 50p", and the second upper electrode interconnection 57" is electrically connected to the second upper electrode contact plugs 52p".

Furthermore, as shown in FIG. 7A, a first power line PL1 and a second power line PL2 may be formed on the interlayer insulating layer 45 in the first peripheral circuit region P1, and a third power line PL3 and a fourth power line PL4 may be formed on the interlayer insulating layer 45 in the second peripheral circuit region P2. In this case, the first lower electrode interconnection 55' may be connected to the first power line PL1, and the first upper electrode interconnection 57' may be connected to the second power line PL2. Accordingly, a first MOS-type decoupling capacitor having the first dielectric layer 25c' interposed between the first and second power lines PL1 and PL2 may be formed.

Also, the second lower electrode interconnection 55" may be connected to the third power line PL3, and the second upper electrode interconnection 57" may be connected to the fourth power line PL4. Accordingly, a second MOS-type decoupling capacitor having the second dielectric layer 25c" interposed between the third and fourth power lines PL3 and PL4 may be formed.

A potential difference between power supply voltages applied to the first MOS-type decoupling capacitor may be larger than a potential difference between power supply voltages applied to the second MOS-type decoupling capacitor. For example, the first power line PL1 may be a ground voltage GND, and the second power line PL2 may be a boosted internal power supply Vpp for supplying a voltage to the word line WL. Also, the third power line PL3 may be a ground voltage GND, and the fourth power line PL4 may be an external power supply Vext or a dropped internal power supply Vint. In this case, when the semiconductor substrate 5 has a different conductivity type from the first and second impurity regions 35' and 35", the semiconductor substrate 5 may be grounded.

In comparison to the conventional technique, the thickness of the dielectric layer of the first MOS-type decoupling capacitor increases, but the effective area of the first MOS-type decoupling capacitor may increase because of the first capacitor trenches 10t'. That is, the effective area of the first MOS-type decoupling capacitor may increase in various manners by changing the dimension, depth, and number of the first capacitor trenches 10t'. As a result, it can be designed such that the first MOS-type decoupling capacitor has a capacitance equal to or larger than that of a conventional decoupling capacitor. For instance, when the thickness of the first dielectric layer 25c' is doubled, the effective area of the first MOS-type decoupling capacitor may be doubled using the first capacitor trenches 10t' so that the first MOS-type decoupling capacitor may have a capacitance equal to or larger than that of the conventional capacitor. Also, with an increase in the thickness of the first dielectric layer 25c', breakdown of the dielectric layer may be prevented even between two power supply lines having a high potential difference. As a result, the reliability of the semiconductor device may be improved.

In comparison to the conventional technique, the thickness of the dielectric layer of the second MOS-type decoupling capacitor remains the same, but the effective area of the second MOS-type decoupling capacitor may increase because of the second capacitor trenches 10t''. That is, the effective area of the second MOS-type decoupling capacitor may increase in various manners by changing the dimension, depth, and number of the second capacitor trenches 10t''. As a result, the second MOS-type decoupling capacitor has a capacitance larger than that of the conventional decoupling capacitor by the increased effective area. For instance, the second capacitor trenches 10t'' may double the effective area of the second MOS-type decoupling capacitor so that the second MOS-type decoupling capacitor may have a capacitance twice that of the conventional capacitor.

The first MOS-type decoupling capacitor is electrically connected between two power lines having a high potential difference, and the second MOS-type decoupling capacitor is electrically connected between two power lines having a low potential difference. Thus, breakdown of the dielectric layer may be prevented according to each potential difference, so that the reliability of the semiconductor device may be improved and the first and second MOS-type decoupling capacitors may have maximum capacitance.

In another case, the mask pattern 20 may be formed to cover the second peripheral circuit region P2 but expose the cell region CA and the first peripheral circuit region P1, in contrast to the approach described above with reference to FIGS. 3A and 3B. Subsequently, the same operation as described with reference to FIGS. 4A and 4B is carried out. As a result, the second dielectric layer 25'' may be formed thicker than the first dielectric layer 25'. Therefore, the potential difference between the power supply voltages applied to the first MOS-type decoupling capacitor may be less than the potential difference between the power supply voltages applied to the second MOS-type decoupling capacitor.

Hereinafter, a semiconductor device having a decoupling capacitor according to exemplary embodiments of the present invention will be described with reference to FIGS. 7A and 7B.

Referring to FIGS. 7A and 7B, the semiconductor device includes a semiconductor substrate 5 having a cell region CA, a first peripheral circuit region P1, and a second peripheral circuit region P2. An isolation layer 7 is disposed in the semiconductor substrate 5 to define a cell active region A, a first peripheral circuit active region AP1, and a second peripheral circuit active region AP2. The isolation layer 7 may be a trench isolation layer. Channel trenches 10t are disposed in the cell region CA of the semiconductor substrate 5 across the cell region A. Each of the channel trenches 10t may include an upper trench and a lower trench, and the lower trench may have a larger width than the upper trench.

Also, first capacitor trenches 10t' may be disposed in the first peripheral circuit region P1 of the semiconductor substrate 5, and second capacitor trenches 10t'' may be disposed in the second peripheral circuit region P2 of the semiconductor substrate 5. The first and second capacitor trenches 10t' and 10t'' may have a line shape, a circular shape, or an oval shape when seen from a plan view. In the present embodiment, the first and second capacitor trenches 10t' and 10t'' may be disposed in line shapes. Like the channel trenches 10t, each of the first and second capacitor trenches 10t' and 10t'' may include an upper trench and a lower trench, and the lower trench may have a larger width than the upper trench.

In order to prevent a short channel effect caused by the high integration density of the semiconductor device, the channel trenches 10t may be disposed to increase a channel length. On the other hand, the first and second capacitor trenches 10t', 11t', 12t', 10t'', 11t'', and 12t'' may be disposed to increase the effective areas of MOS-type decoupling capacitors.

Gate electrodes 30g are disposed in the cell region CA of the semiconductor substrate 5 across the cell active region A such that the gate electrodes 30g fill the channel trenches 10t, respectively. A first upper electrode 30' is disposed in the first peripheral circuit region P1 of the semiconductor substrate 5 to fill the first capacitor trenches 10t' at the same time. The first upper electrode 30' may be disposed across the first peripheral circuit active region AP1 or disposed to expose edges of the first peripheral circuit active region AP1. Also, a second upper electrode 30'' is disposed in the second peripheral circuit region P2 of the semiconductor substrate 5 to fill the second capacitor trenches 10t'' at the same time. The second upper electrode 30'' may be disposed across the second peripheral circuit active region AP2 or disposed to expose edges of the second peripheral circuit active region AP2.

A gate dielectric layer 25g is interposed between the channel trenches 10t and the gate electrodes 30g. A first dielectric layer 25c' is interposed between the semiconductor substrate 5 of the first peripheral circuit region P1 having the first capacitor trenches 10t' and the first upper electrode 30'. Also, a second dielectric layer 25'' is interposed between the semiconductor substrate 5 of the second peripheral circuit region P2 having the second capacitor trenches 10t'' and the second upper electrode 30''. The first dielectric layer 25c' has the same thickness as the gate dielectric layer 25g, and the second dielectric layer 25'' has a different thickness from the first dielectric layer 25'. Here, the second dielectric layer 25'' may have a smaller thickness than the first dielectric layer 25'. Alternatively, the second dielectric layer 25'' may have a larger thickness than the first dielectric layer 25'. In the present embodiment, the second dielectric layer 25'' has a smaller thickness than the first dielectric layer 25'.

Spacers 32 may be disposed on the semiconductor substrate 5 having the gate dielectric layer 25g and the first and second dielectric layers 25c' and 25c'' to cover sidewalls of the gate electrodes 30g and the first and second upper electrodes 30' and 30''. A source region 35s and a drain region 35d may be disposed in the cell active region A at both sides of the gate electrodes 30g, respectively. First impurity regions 35' may be disposed in the first peripheral circuit active region AP1 adjacent to the first upper electrode 30'. Also, second impurity regions 35'' may be disposed in the second peripheral circuit active region AP2 adjacent to the second upper electrode 30''.

An interlayer insulating layer 45 is disposed on the semiconductor substrate 5 having the source region 35s, the drain region 35d, and the impurity regions 35' and 35''. First lower electrode contact holes 50h' may be disposed through the interlayer insulating layer 45 to expose predetermined regions of the first impurity regions 35', and first upper electrode contact holes 52h' may be disposed through the interlayer insulating layer 45 to expose predetermined regions of the first upper electrode 30'. Also, second lower electrode contact holes 50h'' may be disposed through the interlayer insulating layer 45 to expose predetermined regions of the second impurity regions 35'', and second upper electrode contact holes 52h'' may be disposed through the interlayer insulating layer 45 to expose predetermined regions of the second upper electrode 30''.

First lower electrode contact plugs 50p' may be disposed to fill the first lower electrode contact holes 50h', first upper electrode contact plugs 52p' may be disposed to fill the first upper electrode contact holes 52h', second lower electrode contact plugs 50p'' may be disposed to fill the second lower electrode contact holes 50h'', and second upper electrode contact plugs 52p'' may be disposed to fill the second upper electrode contact holes 52h''.

Thereafter, a first lower electrode interconnection 55', a first upper electrode interconnection 57', a second lower electrode interconnection 55'', and a second upper electrode interconnection 57'' may be disposed on the semiconductor substrate 5 having the contact plugs 50p', 52p', 50p'', and 52p''. The first lower electrode interconnection 55' is electrically connected to the first lower electrode contact plugs 50p', and the first upper electrode interconnection 57' is electrically connected to the first upper electrode contact plugs 52p'. Also, the second lower electrode interconnection 55'' is electrically connected to the second lower electrode contact plugs 50p'', and the second upper electrode interconnection 57'' is electrically connected to the second upper electrode contact plugs 52p''.

As shown in FIG. 7A, a first power line PL1 and a second power line PL2 may be disposed on the interlayer insulating layer 45 in the first peripheral circuit region P1, and a third power line PL3 and a fourth power line PL4 may be disposed on the interlayer insulating layer 45 in the second peripheral circuit region P2. In this case, the first lower electrode interconnection 55' may be connected to the first power line PL1, and the first upper electrode interconnection 57' may be connected to the second power line PL2. Accordingly, a first MOS-type decoupling capacitor having the first dielectric layer 25c' interposed between the first and second power lines PL1 and PL2 may be disposed. Also, the second lower electrode interconnection 55'' may be connected to the third power line PL3, and the second upper electrode interconnection 57'' may be connected to the fourth power line PL4. Accordingly, a second MOS-type decoupling capacitor having the second dielectric layer 25c'' interposed between the third and fourth power lines PL3 and PL4 may be disposed.

A potential difference between power supply voltages applied to the first MOS-type decoupling capacitor may be larger than a potential difference between power supply voltages applied to the second MOS-type decoupling capacitor. For example, the first power line PL1 may be a ground voltage GND, and the second power line PL2 may be a boosted internal power supply Vpp for supplying a voltage to a word line. Also, the third power line PL3 may be a ground voltage GND, and the fourth power line PL4 may be an external power supply Vext or a dropped internal power supply Vint. In this case, when the semiconductor substrate 5 has a different conductivity type from the first and second impurity regions 35' and 35'', the semiconductor substrate 5 may be grounded.

Alternatively, when the second dielectric layer 25'' is thicker than the first dielectric layer 25', the potential difference between the power supply voltages applied to the first MOS-type decoupling capacitor may be less than the potential difference between the power supply voltages applied to the second MOS-type decoupling capacitor.

In comparison to the conventional technique, the thickness of the dielectric layer of the first MOS-type decoupling capacitor increases, but the effective area of the first MOS-type decoupling capacitor may increase because of the first capacitor trenches 10t'. That is, the effective area of the first MOS-type decoupling capacitor may increase in various manners by changing the dimension, depth, and number of the first capacitor trenches 10t'. As a result, it can be designed such that the first MOS-type decoupling capacitor has a capacitance equal to or larger than that of a conventional decoupling capacitor. For instance, when the thickness of the first dielectric layer 25c' is doubled, the first capacitor trenches 10t' may double the effective area of the first MOS-type decoupling capacitor so that the first MOS-type decoupling capacitor may have a capacitance equal to or larger than that of the conventional capacitor. Also, with an increase in the thickness of the first dielectric layer 25c', breakdown of the dielectric layer may be prevented even between two power supply lines having a high potential difference. As a result, the reliability of the semiconductor device may be improved.

In comparison to the conventional technique, the thickness of the dielectric layer of the second MOS-type decoupling capacitor remains the same, but the effective area of the second MOS-type decoupling capacitor may increase because of the second capacitor trenches 10t'''. That is, the effective area of the second MOS-type decoupling capacitor may increase in various manners by changing the dimension, depth, and number of the second capacitor trenches 10t'''. As a result, the second MOS-type decoupling capacitor may have a capacitance larger than that of the conventional decoupling capacitor by the increased effective area. For instance, the second capacitor trenches 10t''' may double the effective area of the second MOS-type decoupling capacitor so that the second MOS-type decoupling capacitor may have a capacitance twice that of the conventional capacitor.

The first MOS-type decoupling capacitor is electrically connected between two power lines having a high potential difference, and the second MOS-type decoupling capacitor is electrically connected between two power lines having a low potential difference. As a result, breakdown of the dielectric layer may be prevented according to each potential difference, so that the reliability of the semiconductor device may be improved and the first and second MOS-type decoupling capacitors may have maximum capacitance.

According to the present invention as described above, while channel trenches are formed in a cell region, capacitor trenches are formed in empty regions of peripheral regions, so that the effective areas of decoupling capacitors may increase. Thus, capacitance per unit area may increase compared to a conventional technique. Also, a decoupling capacitor connected between power supply lines having a high potential difference is formed thicker than a decoupling capacitor connected between power supply lines having a low potential difference. As a result, breakdown of dielectric layers may be prevented, thus improving the reliability of a semiconductor device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a semiconductor device, comprising:
preparing a semiconductor substrate having a cell region, a first peripheral circuit region, and a second peripheral circuit region;
forming at least one channel trench in the cell region of the semiconductor substrate, forming at least one first capacitor trench in the first peripheral circuit region of the semiconductor substrate, and forming at least one second capacitor trench in the second peripheral circuit region of the semiconductor substrate;

covering an inner wall of the channel trench with a gate dielectric layer, covering at least an inner wall of the first capacitor trench with a first dielectric layer, and covering at least an inner wall of the second capacitor trench with a second dielectric layer, wherein the first dielectric layer has the same thickness as the gate dielectric layer and a different thickness from the second dielectric layer;

filling the channel trench covered with the gate dielectric layer with a gate electrode, filling the first capacitor trench covered with the first dielectric layer with a first upper electrode, and filling the second capacitor trench covered with the second dielectric layer with a second upper electrode; and implanting impurity ions into the semiconductor substrate to form a source region and a drain region in the cell region of the semiconductor substrate, the source region and the drain region being formed at opposite sides of the gate electrode.

2. The method according to claim 1, further comprising, after forming the gate electrode and the first and second upper electrodes, implanting impurity ions into the semiconductor substrate using the gate electrode and the first and second upper electrodes as ion implantation masks to form the source region and the drain region in the cell region of the semiconductor substrate and simultaneously form a first impurity region and a second impurity region in the first and second peripheral circuit regions of the semiconductor substrate, respectively.

3. The method according to claim 2, further comprising:
after implanting the impurity ions into the semiconductor substrate,
forming an interlayer insulating layer on the semiconductor substrate having the gate electrode and the first and second upper electrodes;
forming contact plugs electrically connected to the first impurity region, the first upper electrode, the second impurity region, and the second upper electrode, respectively, through the interlayer insulating layer; and
forming a first lower electrode interconnection, a first upper electrode interconnection, a second lower electrode interconnection, a second upper electrode interconnection on the semiconductor substrate having the contact plugs, the first lower electrode interconnection, the first upper electrode interconnection, the second lower electrode interconnection, the second upper electrode interconnection being electrically connected to the first impurity region, the first upper electrode, the second impurity region, and the second upper electrode, respectively.

4. The method according to claim 1, wherein each of the first and second capacitor trenches includes an upper trench and a lower trench.

5. The method according to claim 4, wherein the lower trench has a larger width than the upper trench.

6. The method according to claim 1, wherein the gate dielectric layer, the first dielectric layer, and the second dielectric layer are formed of thermal oxide layers.

7. The method according to claim 1, wherein the second dielectric layer is formed thinner than the first dielectric layer.

8. The method according to claim 1, wherein the second dielectric layer is formed thicker than the first dielectric layer.

9. A method of fabricating a semiconductor device, comprising:

preparing a semiconductor substrate having a cell region, a first peripheral circuit region, and a second peripheral circuit region;

forming at least one channel trench in the cell region of the semiconductor substrate, forming at least one first capacitor trench in the first peripheral circuit region of the semiconductor substrate, and forming at least one second capacitor trench in the second peripheral circuit region of the semiconductor substrate;

covering an inner wall of the channel trench with a gate dielectric layer, covering at least an inner wall of the first capacitor trench with a first dielectric layer, and covering at least an inner wall of the second capacitor trench with a second dielectric layer, wherein the first dielectric layer has the same thickness as the gate dielectric layer and a different thickness from the second dielectric layer;

filling the channel trench covered with the gate dielectric layer with a gate electrode, filling the first capacitor trench covered with the first dielectric layer with a first upper electrode, and filling the second capacitor trench covered with the second dielectric layer with a second upper electrode;

after forming the gate electrode and the first and second upper electrodes, implanting impurity ions into the semiconductor substrate using the gate electrode and the first and second upper electrodes as ion implantation masks to form a source region and a drain region in the cell region of the semiconductor substrate and simultaneously form a first impurity region and a second impurity region in the first and second peripheral circuit regions of the semiconductor substrate, respectively;

after implanting the impurity ions into the semiconductor substrate, forming an interlayer insulating layer on the semiconductor substrate having the gate electrode and the first and second upper electrodes;

forming contact plugs electrically connected to the first impurity region, the first upper electrode, the second impurity region, and the second upper electrode, respectively, through the interlayer insulating layer; and forming a first lower electrode interconnection, a first upper electrode interconnection, a second lower electrode interconnection, a second upper electrode interconnection on the semiconductor substrate having the contact plugs, the first lower electrode interconnection, the first upper electrode interconnection, the second lower electrode interconnection, the second upper electrode interconnection being electrically connected to the first impurity region, the first upper electrode, the second impurity region, and the second upper electrode, respectively.

10. The method according to claim 9, wherein each of the first and second capacitor trenches includes an upper trench and a lower trench.

11. The method according to claim 10, wherein the lower trench has a larger width than the upper trench.

12. The method according to claim 9, wherein the gate dielectric layer, the first dielectric layer, and the second dielectric layer are formed of thermal oxide layers.

13. The method according to claim 9, wherein the second dielectric layer is formed thinner than the first dielectric layer.

14. The method according to claim 9, wherein the second dielectric layer is formed thicker than the first dielectric layer.

* * * * *